(12) United States Patent
Mappes et al.

(10) Patent No.: US 8,165,430 B2
(45) Date of Patent: Apr. 24, 2012

(54) OPTICAL ELEMENT AND METHOD FOR ITS MANUFACTURE

(75) Inventors: Timo Mappes, Karlsruhe (DE); Christoph Vannahme, Karlsruhe (DE); Mauno Schelb, Karlsruhe (DE)

(73) Assignee: Forschungszentrum Karlsruhe GmbH, Karlsruhe (DE)

( * ) Notice: Subject to any disclaimer, the term of this patent is extended or adjusted under 35 U.S.C. 154(b) by 301 days.

(21) Appl. No.: 12/539,859

(22) Filed: Aug. 12, 2009

(65) Prior Publication Data

US 2010/0040324 A1 Feb. 18, 2010

(30) Foreign Application Priority Data

Aug. 13, 2008 (DE) .................. 10 2008 038 993

(51) Int. Cl.
*G02B 6/12* (2006.01)
*G02B 6/00* (2006.01)
*G03F 7/20* (2006.01)

(52) U.S. Cl. ............... 385/14; 385/141; 438/32; 216/24

(58) Field of Classification Search ............... 385/28, 385/50, 14, 141; 438/32; 430/321; 216/24
See application file for complete search history.

(56) References Cited

U.S. PATENT DOCUMENTS

| | | | | | |
|---|---|---|---|---|---|
| 4,262,996 | A | * | 4/1981 | Yao | 385/37 |
| 4,275,286 | A | * | 6/1981 | Hackett, Jr. | 219/121.2 |
| 4,896,930 | A | * | 1/1990 | Tsuchitani et al. | 385/122 |
| 4,899,360 | A | * | 2/1990 | Fujita et al. | 372/50.1 |
| 5,172,385 | A | * | 12/1992 | Forrest et al. | 372/50.21 |
| 5,291,572 | A | | 3/1994 | Blonder et al. | |
| 5,526,454 | A | * | 6/1996 | Mayer | 385/49 |
| 5,529,681 | A | * | 6/1996 | Reinecke et al. | 205/70 |
| 5,612,171 | A | * | 3/1997 | Bhagavatula | 430/321 |
| 5,862,168 | A | * | 1/1999 | Schilling et al. | 372/50.1 |
| 5,982,970 | A | * | 11/1999 | Schneider | 385/125 |
| 6,040,246 | A | * | 3/2000 | Goldstein et al. | 438/706 |
| 6,067,393 | A | * | 5/2000 | Kitaoka et al. | 385/49 |
| 6,253,003 | B1 | * | 6/2001 | Nakamura | 385/28 |
| 6,544,334 | B1 | * | 4/2003 | Potyrailo et al. | 506/32 |
| 6,660,192 | B1 | * | 12/2003 | Kim et al. | 506/32 |
| 6,788,867 | B2 | * | 9/2004 | Mule' et al. | 385/129 |
| 6,807,352 | B2 | * | 10/2004 | Mule' et al. | 385/131 |
| 6,947,651 | B2 | * | 9/2005 | Mule' et al. | 385/125 |
| 6,954,576 | B2 | * | 10/2005 | Mule' et al. | 385/131 |

(Continued)

OTHER PUBLICATIONS

Furuya et al., "A Novel Deposit/ Spin Waveguide Interconnection (DSWI) for Semiconductor Integrated Optics", IEEE Transactions on Microwave Theory and Techniques, {IEEE-Trans-Microw-Theory-Tech-USA}, Oct. 1982, vol. MTT-30, No. 10, p. 1771-7.*

(Continued)

*Primary Examiner* — Jack Berman
*Assistant Examiner* — Wyatt Stoffa
(74) *Attorney, Agent, or Firm* — Leydig, Voit & Mayer, Ltd.

(57) ABSTRACT

An optical element includes a substrate having a passive waveguide and a laser waveguide disposed therein. The laser waveguide is in direct contact with the passive waveguide over a surface of contact so as to provide a butt coupling between the passive waveguide and the laser waveguide. A step extends between an upper edge of the passive waveguide and an upper edge of the laser waveguide. A covering is disposed on the passive waveguide so that the covering and the substrate together provide a cladding of lower refractive index around the passive waveguide and so that a hollow space is disposed between a lower edge of the covering and the upper edge of the laser waveguide.

14 Claims, 4 Drawing Sheets

U.S. PATENT DOCUMENTS

| | | | |
|---|---|---|---|
| 7,187,818 B2 * | 3/2007 | Grobnic et al. | 385/14 |
| 7,227,678 B2 * | 6/2007 | Loo et al. | 359/260 |
| 2002/0136481 A1 * | 9/2002 | Mule' et al. | 385/14 |
| 2003/0000918 A1 * | 1/2003 | Kheraj et al. | 216/24 |
| 2003/0161572 A1 * | 8/2003 | Johnck et al. | 385/14 |
| 2004/0258348 A1 * | 12/2004 | Deliwala | 385/14 |
| 2005/0117844 A1 * | 6/2005 | Abeles et al. | 385/39 |
| 2005/0207693 A1 * | 9/2005 | Yokouchi | 385/14 |
| 2005/0207718 A1 * | 9/2005 | Komura et al. | 385/129 |
| 2006/0039653 A1 * | 2/2006 | Painter et al. | 385/50 |
| 2007/0258691 A1 * | 11/2007 | Charters et al. | 385/132 |

OTHER PUBLICATIONS

R. Xia, Fluorene-based polymer gain media for solid-state laser emission across the full visible spectrum, Appl. Phys. Lett. 82, 3599 (2003).*

M. Punke, et al., Organic semiconductor devices for micro-optical applications, dissertation, University of Karlsruhe, 2007.*

Haisma et al., Direct bonding and beyond, Appl. Opt., vol. 46, 6793-6803, 2007.

Henzi et al., Fabrication of Photonic Integrated Circuits by DUV-induced Modification of Polymers, Proc. SPIE 5451, 24-31, 2004.

Kozlov et al., Laser action in organic semiconductor waveguide and double heterostructure devices, Nature, vol. 389, 362-364, 1997.

Kozlov et al., Study of lasing action based an Forster energy transfer in optically pumped organic semiconductor thin films, J. Appl. Phys., vol. 84, 4096-4108, 1998.

Punke, Organic semiconductor devices for micro-optical applications (Organische Halbleiterbauelemente fur mikrooptische Systeme), dissertation, University of Karlsruhe, 2007.

Sinzinger et al., Microoptics, 2nd edition., Wiley-VCH, Weinheim, 183, 2003.

Stroisch, Organic semiconductor lasers based on photonic crystals (Organische Halbleiterlaser auf Basis Photonischer Kristalle), University of Karlsruhe, 2007.

* cited by examiner f)

g)

h)

OPTICAL ELEMENT AND METHOD FOR ITS MANUFACTURE

CROSS REFERENCE TO PRIOR APPLICATIONS

Priority is claimed to German Patent Application No. DE 10 2008 038 993.5, filed on Aug. 13, 2008, the entire disclosure of which is incorporated by reference herein.

FIELD

The present invention relates generally to an optical element, and more specifically to one which includes a substrate in which a passive waveguide and a laser waveguide are formed, and to a method for its manufacture.

BACKGROUND

The paper "Laser action in organic semiconductor waveguide and double-heterostructure devices", Nature, vol. 389, 362-364, 1997, by V. G. Kozlov, V. Bulovic, P. E. Burrows, S. R. Forrest, describes laser waveguides for organic semiconductor lasers having an optical grating which provides distributed feedback of laser light, and is therefore referred to as distributed feedback grating or DFB grating. DFB gratings are periodic structures having dimensions on the order of 10 nm to 1 µm which are formed in the substrate. In the simplest case, a periodic line grating is formed in the substrate.

According to V. G. Kozlov, V. Bulovic, P. E. Burrows, M. Baldo, V. B. Khalfin, G. Parthasarathy, S. R. Forrest, Y. You, M. E. Thompson, "Study of lasing action based an Forster energy transfer in optically pumped organic semiconductor thin films", J. Appl. Phys., vol. 84, 4096-4108, 1998, the life of organic semiconductor lasers is mainly limited by oxidation. Therefore, the operation of such an organic semiconductor laser in practice requires encapsulation of the laser dyes to protect them from photo-oxidation with atmospheric oxygen. According to J. Haisma, N. Hattu, J. T. C. M. Pulles, E. Steding, J. C. G. Vervest, "Direct bonding and beyond", Appl. Opt., vol. 46, 6793-6803, 2007, a covering suitable for this purpose can be affixed by bonding with a substrate on which the semiconductor laser is formed.

The dissertation entitled "Organische Halbleiterlaser auf Basis Photonischer Kristalle (Organic semiconductor lasers based on photonic crystals" by M. Stroisch, University of Karlsruhe, 2007, describes how organic semiconductor lasers can be produced on different substrates, including polymer substrates.

M. Punke, "Organische Halbleiterbauelemente für mikrooptische Systeme (Organic semiconductor devices for micro-optical applications)", dissertation, University of Karlsruhe, 2007, uses a substrate made of polymethyl methacrylate (PMMA) for the organic semiconductor laser. The substrate contains UV-induced waveguides, such as are described by P. Henzi, D. G. Rabus, U. Wallrabe, J. Mohr in "Fabrication of Photonic Integrated Circuits by DUV-induced Modification of Polymers", Proc. SPIE 5451, 24-31, 2004. Here, the coupling of the laser light into the passive waveguide is accomplished by evanescent field coupling. In this manner, laser light can indeed be coupled into the waveguides, but simulations show that the power coupled into a multimode waveguide is no more than about 30%. Moreover, this arrangement cannot be covered because the laser layer is vapor-deposited on the substrate, and the resulting height differences on the substrate make it impossible to apply a covering.

SUMMARY

In an embodiment, the present invention provides an optical element including a substrate having a passive waveguide and a laser waveguide disposed therein. The laser waveguide is in direct contact with the passive waveguide over a surface of contact so as to provide a butt coupling between the passive waveguide and the laser waveguide. A step extends between an upper edge of the passive waveguide and an upper edge of the laser waveguide. A covering is disposed on the passive waveguide so that the covering and the substrate together provide a cladding of lower refractive index around the passive waveguide and so that a hollow space is disposed between a lower edge of the covering and the upper edge of the laser waveguide.

BRIEF DESCRIPTION OF THE DRAWINGS

The present invention is explained below in more detail based on exemplary embodiments and with reference to the accompanying drawings, in which.

DETAILED DESCRIPTION

Figure 1:
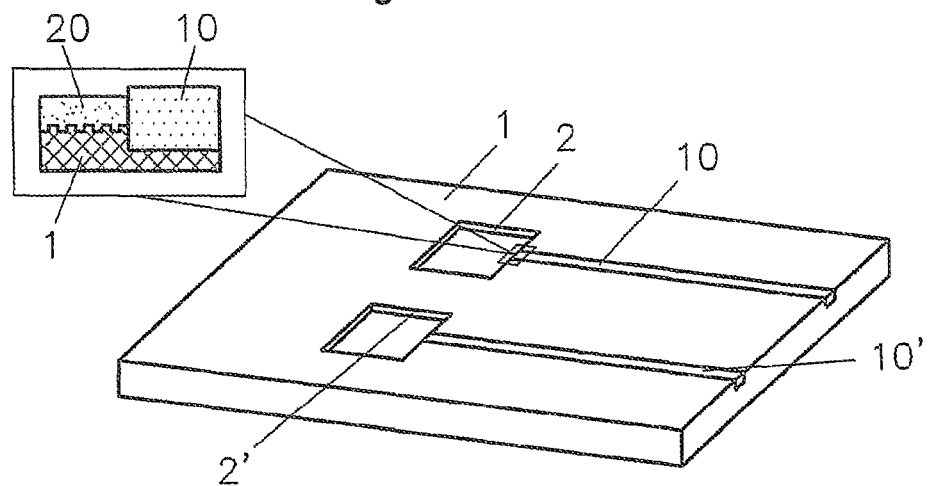
FIG. 1 is a view of an optical element formed by a substrate containing two organic semiconductor lasers and two passive waveguides, shown without covering.

In an embodiment, the present invention provides an optical element, and a method for its manufacture, which overcomes the aforementioned disadvantages and limitations.

The optical element in accordance with an embodiment of the present invention provides a solution to the technical problem of coupling laser light into a waveguide integrated into a substrate and, at the same time, provides a solution to the problem of an organic laser being attacked by atmospheric oxygen.

The optical element according to an embodiment of the present invention includes a substrate in which a passive waveguide is formed, said passive waveguide having a thickness D and an upper edge. As usual, thickness D is defined in that the change of the refractive index in the passive waveguide, which is maximum at the upper edge of the waveguide, has fallen to a value of 1/e compared to the substrate, with e being Euler's number.

Suitable substrates are transparent materials, in particular polymers, glasses or crystalline materials, preferably polymethyl methacrylate (PMMA). The substrate material should have a lower refractive index than the passive waveguide in order to light for laser light to be guided therein.

Also formed in the substrate is a laser waveguide having a thickness d and an upper edge. The laser waveguide has an optical DFB grating which provides distributed feedback of the laser light. The DFB grating consists of periodic structures having dimensions on the order of 10 nm to 1 µm, which are formed in the substrate, in the simplest case as a periodic line grating. The preferred materials for the active laser are organic semiconductors.

In accordance with an embodiment of the present invention, the passive waveguide and the laser waveguide contact each other over a common surface of contact in a manner so as to provide butt coupling between the passive waveguide and the laser waveguide.

According to S. Sinzinger und J. Jahns: "Microoptics", $2^{nd}$ edition., WILEY-VCH, Weinheim, 2003, 183, butt coupling occurs when two waveguides are so closely in contact that a mode propagating in the first waveguide propagates continuously through a surface of contact into the second waveguide.

Accordingly, the passive waveguide and the laser waveguide are in direct contact with each other over the surface of contact in such a manner that the mode(s) in the passive waveguide and the mode(s) in the laser waveguide overlap each other maximally. This is achieved in particular when the distance δ of the peaks of the fundamental modes in the two waveguides is as small as possible. Preferably the following relationship exists:

$$\delta \leq d/2,$$

where d is the average thickness of the laser waveguide.

In accordance with an embodiment of the present invention, in the case of monomode waveguides; i.e., waveguides in which only the fundamental mode propagates, the refractive index step between the laser waveguide (laser waveguide core) and its surroundings is larger than the refractive index step between the passive waveguide (passive waveguide core) and its surroundings. The consequence of this for monomode waveguides is that the extent of the guided mode in the passive waveguide is larger than in the laser waveguide. Therefore, in the passive waveguide, the maximum of the field distribution is located further away from the upper waveguide boundary.

Thus, in order to achieve better coupling between the passive waveguide and the laser waveguide, it is particularly advantageous to arrange the passive waveguide and the laser waveguide relative to each other in such a way that the edge of the passive waveguide extends beyond that of the laser waveguide. This arrangement allows the laser to be covered by applying a covering on the passive waveguide.

If the passive waveguide is a multimode waveguide whose core has a greater extent than that of the laser waveguide, then the refractive index step in the passive waveguide does not need to be greater than in the laser waveguide.

Therefore, in accordance with another embodiment of the present invention, the passive waveguide and the laser waveguide are arranged relative to each other in such a way that a step having a height H is formed between the upper edge of the passive waveguide and the upper edge of the laser waveguide, with H being governed by the relationship:

$$0 \leq H \leq D-d$$

where ≦ means smaller than or equal to.

Preferably, thickness D of the passive waveguide is from 1 μm to 100 μm, and average thickness d of the laser waveguide is from 0.1 μm to 1 μm.

More preferably, thickness D of the passive waveguide is from 4 μm to 50 μm, and thickness d of the laser waveguide is from 0.1 μm to 0.4 μm. In the case of most of the laser waveguides being formed on a PMMA substrate, these thicknesses ensure that more than one mode propagates in the laser waveguide (monomode waveguide) when laser light in the visible range is coupled in.

According to an embodiment of the present invention, a covering is applied to the upper edge of the passive waveguide in such a way that the substrate and the covering together enclose the passive waveguide laterally, providing a cladding of lower refractive index for the passive waveguide.

The material selected for the covering is a transparent material, preferably a polymer or glass. The material should be selected such that the optical refractive index of the passive waveguide is greater than that of the surroundings formed by the substrate and the covering in order to ensure the proper operation of an optical waveguide that is based on the principle of total internal reflection.

Further, the covering is arranged such that a hollow space is formed between the upper edge of the laser waveguide and the lower edge of the covering. This hollow space is preferably evacuated or filled with inert gas to prevent oxidation of the laser waveguide material.

Preferably, the optical element is formed from as follows:
the substrate is made of polymethyl methacrylate (PMMA),
one ore more passive waveguides are formed in the substrate by UV irradiation,
a covering of polymethyl methacrylate is applied to the upper edges of the passive waveguides.

Also formed in the substrate are one or more laser waveguides, which each contain an organic semiconductor layer as the laser-active layer.

The laser waveguide is preferably composed of a host material into which laser-active guest molecules are introduced, or of a conjugated polymer.

Organic semiconductor materials which, as a guest-host system, function mainly by Förster Energy Transfer require a controlled composition of the material constituents. It is preferred to use the Alq3:DCM guest-host system, where Alq3 stands for the host material tris(8-hydroxyquinolinate)aluminum, and DCM stands for the guest molecule 4-(dicyanomethylene)-2-methyl-6-(p-dimethylaminostyryl)-4H-pyran.

The conjugated polymer is preferably selected one of the following polymers:
MEH-PPV; i.e., 1-(3-(methoxycarbonyl)propyl)-1-phenyl,
BN-PFO, where BN stands for 2,7-(9,9'-dioctylfluorene) and PFO stands for 6,6'-(2,2'-octyloxy-1,1'-binaphthyl), or
F8DP; i.e., poly(9,9'-dioctylfluorene-co-9,9'-di(4-methoxy) phenylfluorene).

An optical element according to an embodiment of the present invention can be made by the following procedure:

Initially, in a step (a), a first-order optical grating having feature sizes in the range of 100 nm is patterned for the (later) laser waveguide to be provided. Patterning is done in particular by electron beam lithography, direct laser writing, laser interference lithography in a photosensitive material, or by self-organization. The pattern can be transferred by etching to a glass or a crystalline material, such as silicon or a suitable silicon compound, such as $SiO_2$.

In a subsequent step (b), a photoresist is deposited on the optical grating produced in step (a), the thickness of the photoresist being set to d+H, where d denotes the thickness of the later laser waveguide and H is the height of the later step between the upper edge of the later passive waveguide and the upper edge of the later laser waveguide.

In a next step (c), the photoresist is removed from a region above the optical grating using lithography, thereby producing a master mold (70) which already has the step to make the plane of the active waveguide lower relative to the passive waveguide.

Then, in a step (d), a metal mold is formed as a topological negative mold from the completed master mold using electroplating. In a step (e), the shape of this mold is then transferred to a substrate by hot-stamping Subsequently, in a step (f), one or more passive waveguides are formed in the substrates, preferably by means of inward diffusion, doping, material deposition techniques, or irradiation. In this connection, the passive waveguide and the later laser waveguide are in direct contact with each other over a surface of contact. The arrangement is such that it enables butt coupling to occur between the passive waveguide and the later laser waveguide.

Subsequently, in a step (g), at least one laser waveguide is produced by depositing a laser material on the transferred patterns of the optical grating. The deposition of the laser material is preferably accomplished by inkjet printing, spin-on deposition from a solution, or using a co-evaporation technique. Organic semiconductor materials which, as a guest-host system, function mainly by Förster Energy Transfer require a controlled composition of the material constituents.

Finally, in a step (h) following step (g), a covering is applied to the upper edge of the at least one passive waveguide, so that an oxygen-free environment is created in the form of a hollow space between the lower edge of the covering and the upper edge of the laser waveguide. In this manner, the organic laser is encapsulated, thereby preventing photo-oxidation with atmospheric oxygen and increasing the life of the laser, which is mainly limited by oxidation.

If the covering is transparent to the particular wavelength, the laser can be optically pumped therethrough. Therefore, suitable covering materials are, in particular, polymer material or glass. The covering (cover) itself is joined to the substrate by adhesive or thermal bonding.

A device according to an embodiment of the present invention can be used in integrated optics. In particular, when used in combination with an interaction region containing an analyte, the device can be used as an optical sensor.

The coupling between the active waveguide (laser waveguide) and the passive waveguide is significantly improved thereby solving the technical problem of coupling laser light into the waveguides integrated into the substrate.

The design of the optical element according to an embodiment of the present invention makes it possible to provide a covering on the laser, which protects the laser material in particular from oxidation processes.

FIG. 1 shows a substrate 1 made of polymethyl methacrylate (PMMA), in which two passive waveguides 10, 10' were formed by UV irradiation, and which are connected to an organic semiconductor laser 2 and 2', respectively. Each of the two organic semiconductor lasers 2, 2' features a laser waveguide 20 formed by an organic semiconductor layer in the form of a DFB grating. The guest-host system used for the organic semiconductor layer was $Alq_3$:DCM.

In the embodiment shown in FIG. 1, laser waveguide 20 is configured as a planar waveguide, while passive waveguides 10, 10' take the form of strip waveguides. In general, however, both laser waveguide 20 and passive waveguides 10, 10' can be configured either as strip waveguides or planar waveguides.

Figure 2:
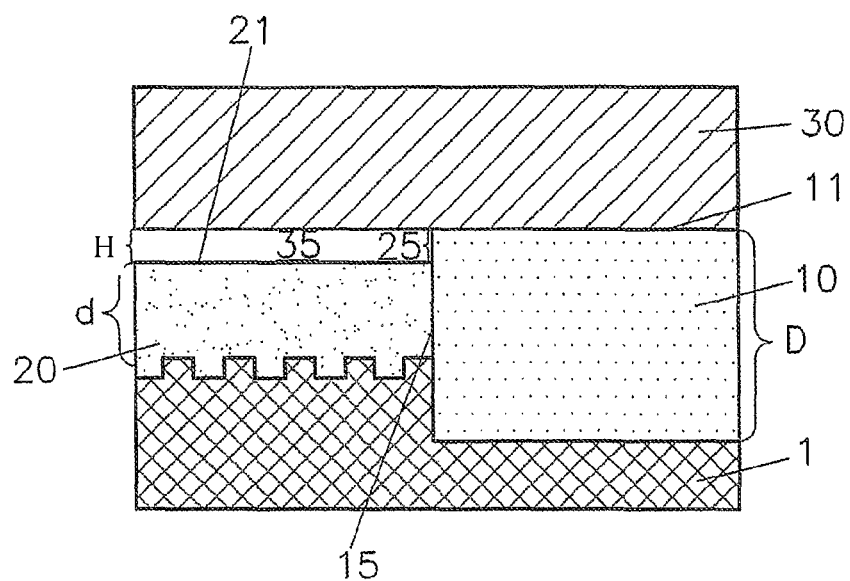
FIG. 2 is a schematic view illustrating the coupling of laser light from the organic semiconductor laser into the passive waveguide, and showing the optical element with a covering.

Referring to FIG. 2, laser waveguide 20 is arranged relative to the associated passive waveguide 10 so as to allow laser light to be guided from laser waveguide 20 to the respective passive waveguide 10 by butt coupling through a surface of contact 15. Passive waveguides 10, 10' are induced in PMMA by irradiation with UV light. This makes it possible to produce waveguides with a small refractive index step compared to the substrate, and thus relatively weak optical confinement.

Figure 3:
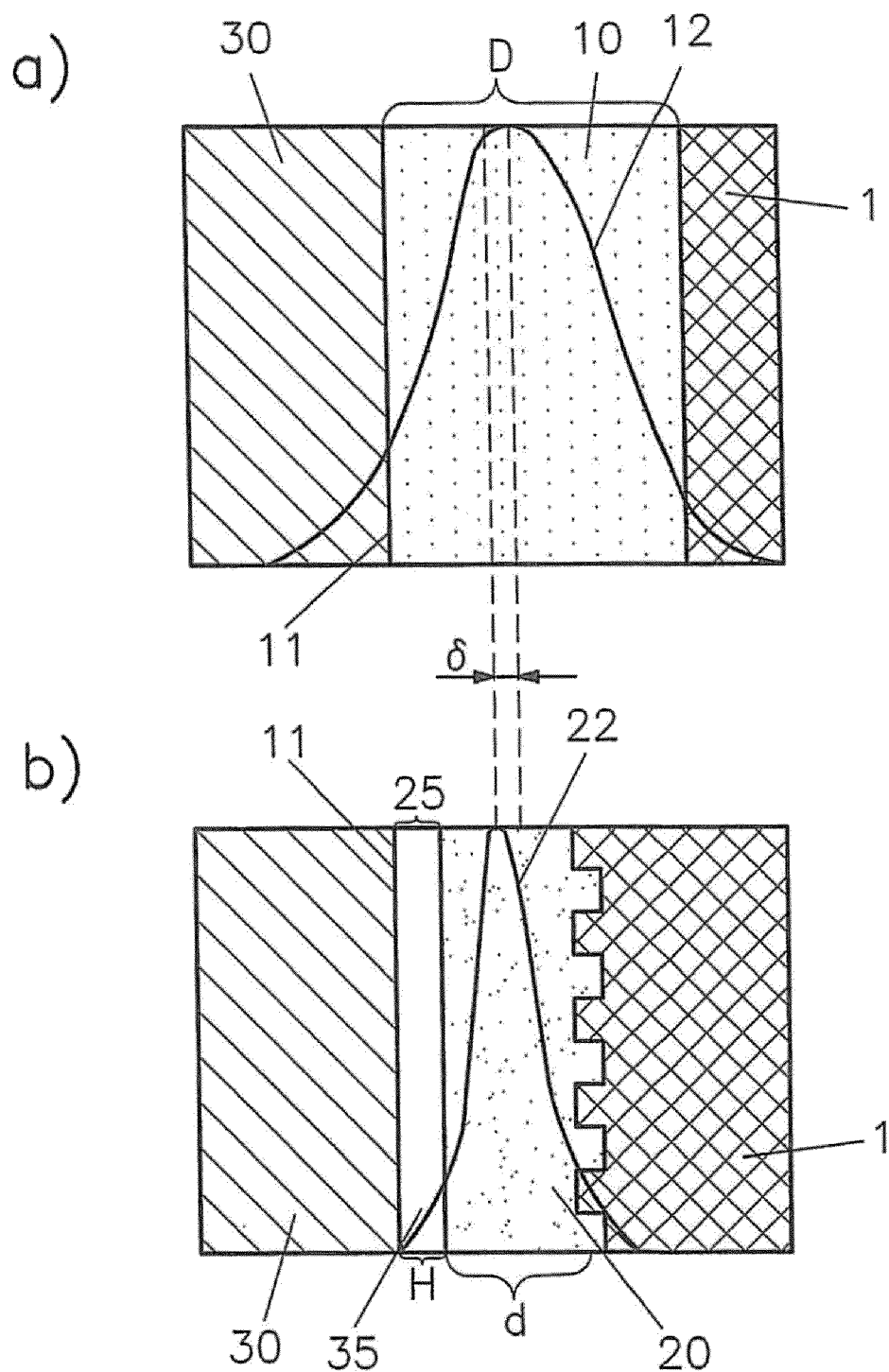
FIG. 3 is a view illustrating the adjustment of the mode position for maximum overlap of the waveguide modes a) in the passive waveguide and b) in the laser waveguide.

In order to improve the coupling between fundamental mode 22 of laser waveguide 20 and fundamental mode 12 of the associated passive waveguide 10 by maximizing the overlap integral of the two fundamental modes 12, 22, such as is shown in FIG. 3, laser waveguide 20 and the respective passive waveguide 10 are arranged in the substrate in such a way that a step 25 is formed therebetween.

FIGS. 3a) and b) are schematic graphs showing the normalized electric field strengths of the two fundamental modes 12, 22 plotted relative to the distance from the upper edge 11 of passive waveguide 10, and distance 8 between the peaks of the two fundamental modes 12, 22. As shown in FIG. 3b), the optical confinement is stronger in monomode laser waveguide 20 and, therefore, the extent of the field distribution is smaller than in the passive monomode waveguide 10, 10' shown in FIG. 3a), and its center is located closer to the surface. Because of this, a step 25 is provided between upper edge 11 of passive waveguide 10 and upper edge 21 of laser waveguide 20.

Further, the device is provided with a covering 30 above laser waveguide 20, said covering being preferably made of PMMA and applied directly to the surface of passive waveguides 10, 10', leaving a region 35 between covering 30 and laser waveguide 20, said region being evacuated or filled with an inert gas (nitrogen, argon).

Figure 4:
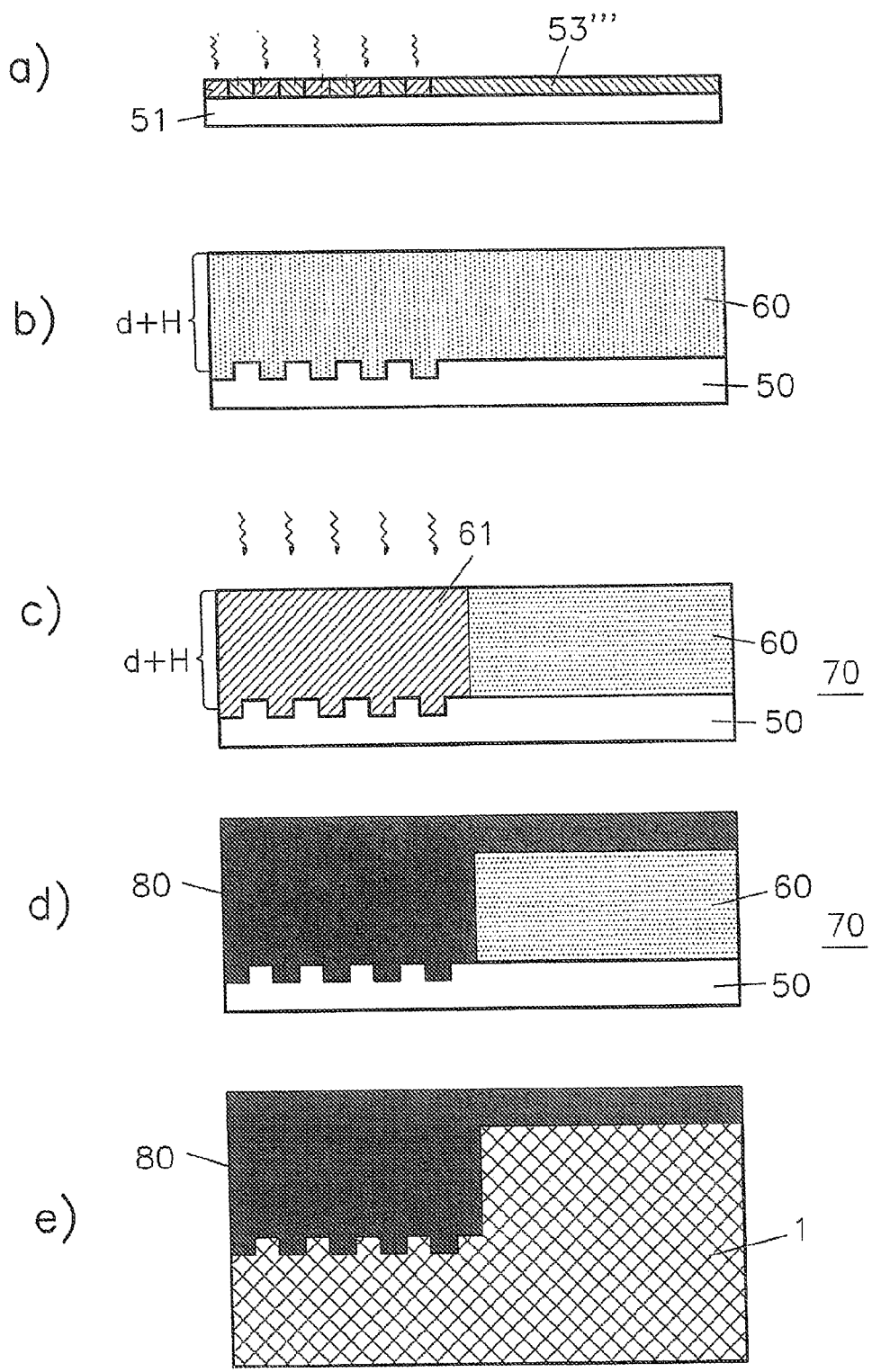
FIG. 4 is a view illustrating a method of the present invention for manufacturing an optical element with a covering.
Figure 4:
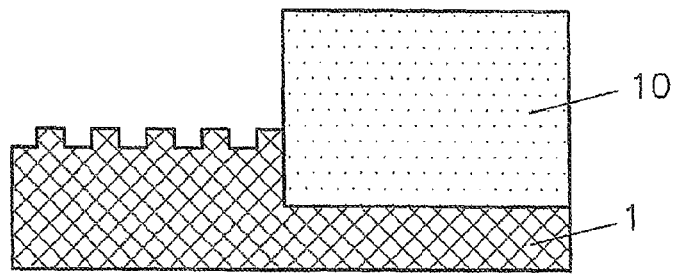
Figure 4:
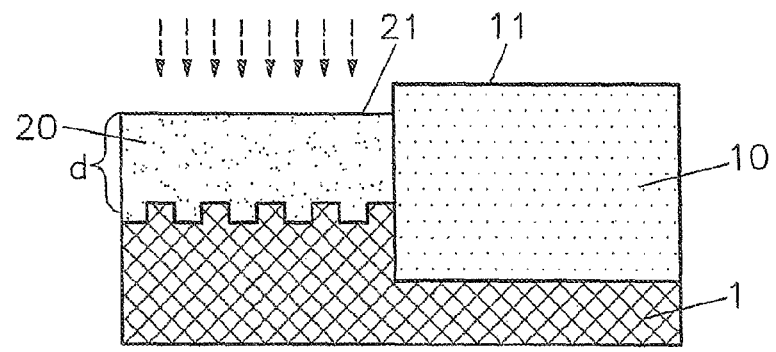
Figure 4:
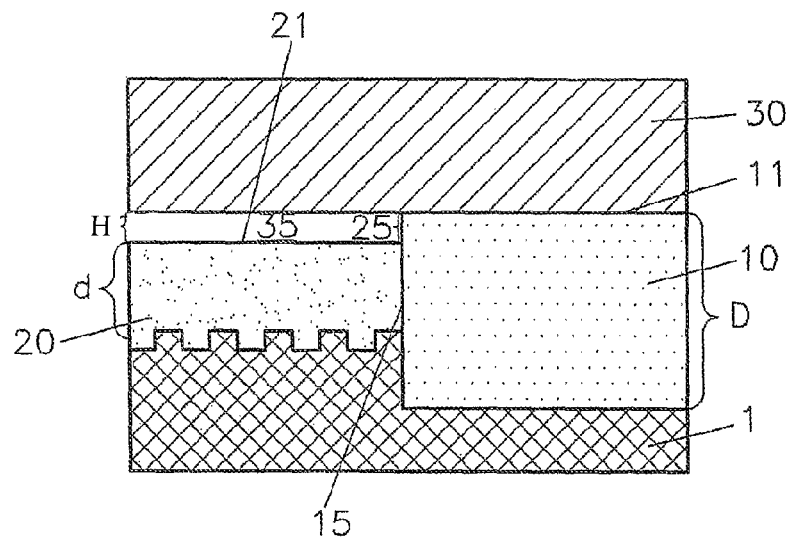

FIG. 4 schematically shows a preferred method for manufacturing the optical element.

Referring to FIG. 4a), the silicon substrate 51 patterned with a grating for distributed optical feedback is made by the following procedure: It is possible to pattern the first-order grating by electron beam lithography on a silicon substrate 51 with or without an oxidized surface, in either a negative or positive photoresist. The use of the negative resist called siloxane-based hydrogen silsesquioxane (HSQ) allows for direct patterning into polymers.

In an alternative embodiment, the lithographically created pattern is transferred to substrate 51 by etching. To this end, initially, a resist is exposed to electron-beam radiation and then developed. Substrate 51 and the resist are coated by vapor deposition with a layer of chromium having a thickness smaller than that of the resist. The chromium that is not in direct contact with the substrate is removed by a lift-off process. The remaining chromium serves as an etching mask, and the pattern is transferred into the substrate to the desired depth by plasma etching (known as reactive ion etching). Subsequently, the chromium is removed. Alternatively, the positive resist may be developed and subsequently used as an etching mask.

Then, as shown in FIG. 4b), a photoresist 60 deposited on the silicon substrate 50 containing the optical DFB grating is exposed and developed. The thickness of photoresist 60 had been set to d+H, where d is the thickness of the laser waveguide 20 to be provided, and H is the height of the step 25 to be provided between upper edge 11 of the later passive waveguide 10 and upper edge 21 of the later laser waveguide 20.

Subsequently, as shown in FIG. 4c), photoresist 60 provided on the silicon substrate 50 containing the optical DFB grating is removed partially; i.e., in a region 61 above the optical grating, using electron beam lithography or optical lithography. A master mold 70 was formed in this manner. As shown in FIG. 4d), a mold 80 is formed as a topological negative mold from master mold 70. Such patterning molds are capable of being produced by electroplating, preferably in nickel.

After that, as shown in FIG. 4e), the pattern of mold 80 is transferred to a substrate 1, thereby transferring the optical grating into substrate 1, preferably by hot-stamping. Alternative methods are casting or UV-nanoimprint lithography, where a polymer substrate is exposed to high-energy UV radiation through a mask having a periodic pattern.

Then, as shown in FIG. 4f), passive waveguide 10 is formed in a PMMA substrate 1 by UV irradiation of the surface regions of substrate 1 that are intended to form the later passive waveguide 10. Alternative methods include inward diffusion, doping, or depositing suitable materials onto substrate 1.

Regardless of the method used, care is taken to form the optical grating in PMMA substrate 1 in such a manner that later, as a laser waveguide 20, it will come into direct contact with passive waveguide 10 over a surface of contact 15 in a manner so as to provide butt coupling between passive waveguide 10 and laser waveguide 20.

Subsequently, as shown in FIG. 4g), laser waveguide 20 is produced by depositing one of the above-mentioned laser materials on the transferred patterns of the optical grating. The deposition of the laser material was done using a co-evaporation technique. Inkjet printing and spin-on deposition from a solution are suitable alternative methods.

Finally, as shown in FIG. 4h), a covering 30 of PMMA is applied to upper edge 11 of passive waveguide 10 by thermal bonding.

After manufacture, measurements are performed on the optical element to ensure that the best possible coupling is achieved between fundamental mode 22 of laser waveguide 20 and fundamental mode 12 of associated passive waveguide 10 by maximizing the overlap integral of the two fundamental modes 12, 22.

While the invention has been particularly shown and described with reference to preferred embodiments thereof, it will be understood by those skilled in the art that various changes in form and details may be made therein without departing from the spirit and scope of the invention.

What is claimed is:

1. An optical element, comprising:
   a substrate;
   a passive waveguide disposed in the substrate;
   a laser waveguide disposed in the substrate and being in direct contact with the passive waveguide over a surface of contact so as to provide a butt coupling between the passive waveguide and the laser waveguide, a step extending between an upper edge of the passive waveguide and an upper edge of the laser waveguide; and
   a covering disposed on and in contact with the passive waveguide and extending over the laser waveguide so that the covering and the substrate together provide a cladding of lower refractive index around the passive waveguide and so that a hollow space is provided between a lower edge of the covering and the upper edge of the laser waveguide.

2. The optical element according to claim 1, wherein the passive waveguide has a thickness between 1 μm and 100 μm and the laser waveguide has an average thickness between 0.1 μm and 1 μm.

3. The optical element according to claim 1, wherein the butt coupling provides a distance between peaks of fundamental modes of the passive waveguide and the laser waveguide in accordance with the formula:

$$\delta \leq d/2$$

wherein $\delta$ is the distance between the peak of the fundamental mode of the passive waveguide and the peak of the fundamental mode of the laser waveguide, and wherein d is an average thickness of the laser waveguide.

4. The optical element according to claim 1, wherein the covering includes a transparent material.

5. The optical element according to claim 1, wherein the hollow space is at least one of evacuated and filled with inert gas.

6. The optical element according to claim 1, wherein the substrate and the covering include polymethyl methacrylate and the passive waveguide is formed into the substrate by at least one of ultraviolet radiation and doping.

7. The optical element according to claim 1, wherein the laser waveguide includes an organic semiconductor layer.

8. The optical element according to claim 7, wherein the laser waveguide includes a host material configured to receive laser-active guest molecules.

9. The optical element according to claim 8, wherein the host material includes tris(8-hydroxyquinolinate)aluminum and the guest molecules include 4-(dicyanomethylene)-2-methyl-6-(p-dimethylaminostyryl)-4H-pyran.

10. The optical element according to claim 7, wherein the laser waveguide includes a conjugated polymer.

11. The optical element according to claim 10, wherein the conjugated polymer includes at least one of MEH-PPV, BN-PFO and F8DP;
    wherein MEH-PPV is 1-(3-(methoxycarbonyl)propyl)-1-phenyl;
    BN is 2,7-(9,9'-dioctylfluorene) and PFO is 6,6'-(2,2'-octyloxy-1,1'-binaphthyl); and
    F8DP is poly(9,9'-dioctylfluorene-co-9,9'-di(4-methoxy)phenylfluorene).

12. A method of manufacturing an optical element, comprising:
    patterning an optical grating into a first substrate;
    depositing a photoresist onto the patterned first substrate at a thickness of d+H,
    wherein d is an average thickness of a laser waveguide of the optical element and H is an average height of a step of the optical element between an upper edge of a passive waveguide of the optical element and an upper edge of the laser waveguide;
    removing the photoresist from a region above the optical grating by lithography so as to produce a master mold;
    producing a topological negative mold of the master mold;
    transferring an optical grating pattern of the topological negative mold to a second substrate;
    forming the passive waveguide in the second substrate;
    depositing a laser material onto the transferred optical grating pattern so as to produce the laser waveguide in direct contact with the passive waveguide over a surface of contact such that a butt coupling is provided between the passive waveguide and the laser waveguide; and
    providing a covering on the upper edge of the passive waveguide,
    wherein the covering extends over the laser waveguide and is disposed at a distance from the upper edge of the laser waveguide so as to provide a hollow space between a lower edge of the covering and the upper edge of the laser waveguide.

13. The method according to claim 12, wherein the forming of the passive waveguide includes at least one of doping and exposing a surface region of the second substrate to ultraviolet radiation.

14. The optical element according to claim 1, wherein the laser waveguide is disposed on an optical grating pattern on the substrate.

* * * * *